(12) United States Patent
Roberts et al.

(10) Patent No.: US 7,184,853 B2
(45) Date of Patent: Feb. 27, 2007

(54) LITHOGRAPHY METHOD AND SYSTEM WITH CORRECTION OF OVERLAY OFFSET ERRORS CAUSED BY WAFER PROCESSING

(75) Inventors: William Roberts, Mechanicsville, VA (US); Christopher Gould, Quinton, MD (US); Nicholas Louka, Richmond, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 36 days.

(21) Appl. No.: 11/131,356

(22) Filed: May 18, 2005

(65) Prior Publication Data

US 2006/0265097 A1   Nov. 23, 2006

(51) Int. Cl.
*G06F 19/00* (2006.01)
(52) U.S. Cl. ...................... 700/124; 700/121
(58) Field of Classification Search ................ 700/119, 700/120, 121, 124, 125
See application file for complete search history.

(56) References Cited

U.S. PATENT DOCUMENTS

| | | | |
|---|---|---|---|
| 4,703,434 A * | 10/1987 | Brunner | 716/21 |
| 6,436,595 B1 * | 8/2002 | Credendino et al. | 430/22 |
| 2002/0098707 A1 | 7/2002 | Ning | |
| 2002/0146628 A1 * | 10/2002 | Ota | 430/22 |
| 2002/0180983 A1 * | 12/2002 | Ina et al. | 356/511 |
| 2003/0074639 A1 | 4/2003 | Park et al. | |
| 2003/0115556 A1 | 6/2003 | Conrad et al. | |
| 2004/0263828 A1 | 12/2004 | Kim | |
| 2005/0023709 A1 | 2/2005 | Chien | |
| 2005/0136346 A1 * | 6/2005 | Ottens et al. | 430/30 |
| 2005/0181571 A1 * | 8/2005 | Lin et al. | 438/377 |
| 2005/0240895 A1 * | 10/2005 | Smith et al. | 716/19 |
| 2006/0064194 A1 * | 3/2006 | Lee | 700/121 |

* cited by examiner

*Primary Examiner*—Chad Rapp
(74) *Attorney, Agent, or Firm*—Edell, Shapiro & Finnan, LLC

(57) ABSTRACT

A method of controlling lithographic overlay offsets in the manufacture of semiconductor devices from wafers, comprising the steps of forming a lithographic pattern on a wafer layer with a lithographic tool, processing the wafer after the pattern is formed to enable fabrication of a semiconductor device, predicting overlay offset corrections based on one or more factors involved in the processing of the wafer, and utilizing the predicted overlay offset corrections to positionally control the lithographic tool.

17 Claims, 4 Drawing Sheets

LITHOGRAPHY METHOD AND SYSTEM WITH CORRECTION OF OVERLAY OFFSET ERRORS CAUSED BY WAFER PROCESSING

BACKGROUND OF THE INVENTION

The invention relates generally to semiconductor lithography, and particularly to controlling overlay offset errors.

A semiconductor device is typically built up of a number of levels which overlie each other. In the usual case, the registration of one layer with the next is not perfect, i.e., there is some overlay offset between successive layers. For any given semiconductor device, there is a parameter corresponding to the total amount of offset which can be tolerated for the device as a whole, known as an overlay budget.

In the prior art, it is known to provide offset error control which compensates for those factors which are involved in the lithography operation itself. However, effects which are external to the lithography operation can also affect offset, and the prior art has not addressed such problem. In particular, effects which occur in the processing of the wafer which takes place after the lithography operation is completed can affect overlay offsets. By way of a specific illustrative example, a chemical-mechanical polishing (CMP) tool having a rotating pad may be used to flatten and polish a level before the next level is built. It has been observed that such tool may add a rotational offset to the level polished, which if not compensated for will adversely affect the placement of each successive layer. There are actually many processing factors which can affect overlay offset, and by way of non-limitative examples these include non-uniform etching, the specific type of film being processed, and the state of a sputtering tool which is used to accomplish metal deposition.

SUMMARY OF THE INVENTION

In accordance with the present invention, overlay offset errors due to processing factors are addressed by forming a lithographic pattern on a wafer layer with a lithographic tool, processing the wafer after the lithographic pattern is formed to enable the fabrication of a semiconductor device, predicting overlay offset corrections based on one or more factors involved in the processing of the wafer, and utilizing the predicted overlay offset corrections to positionally control the lithographic tool.

BRIEF DESCRIPTION OF THE DRAWINGS

The invention will be better understood by referring to the accompanying drawings wherein.

DETAILED DESCRIPTION OF PREFERRED EMBODIMENTS

Figure 1:
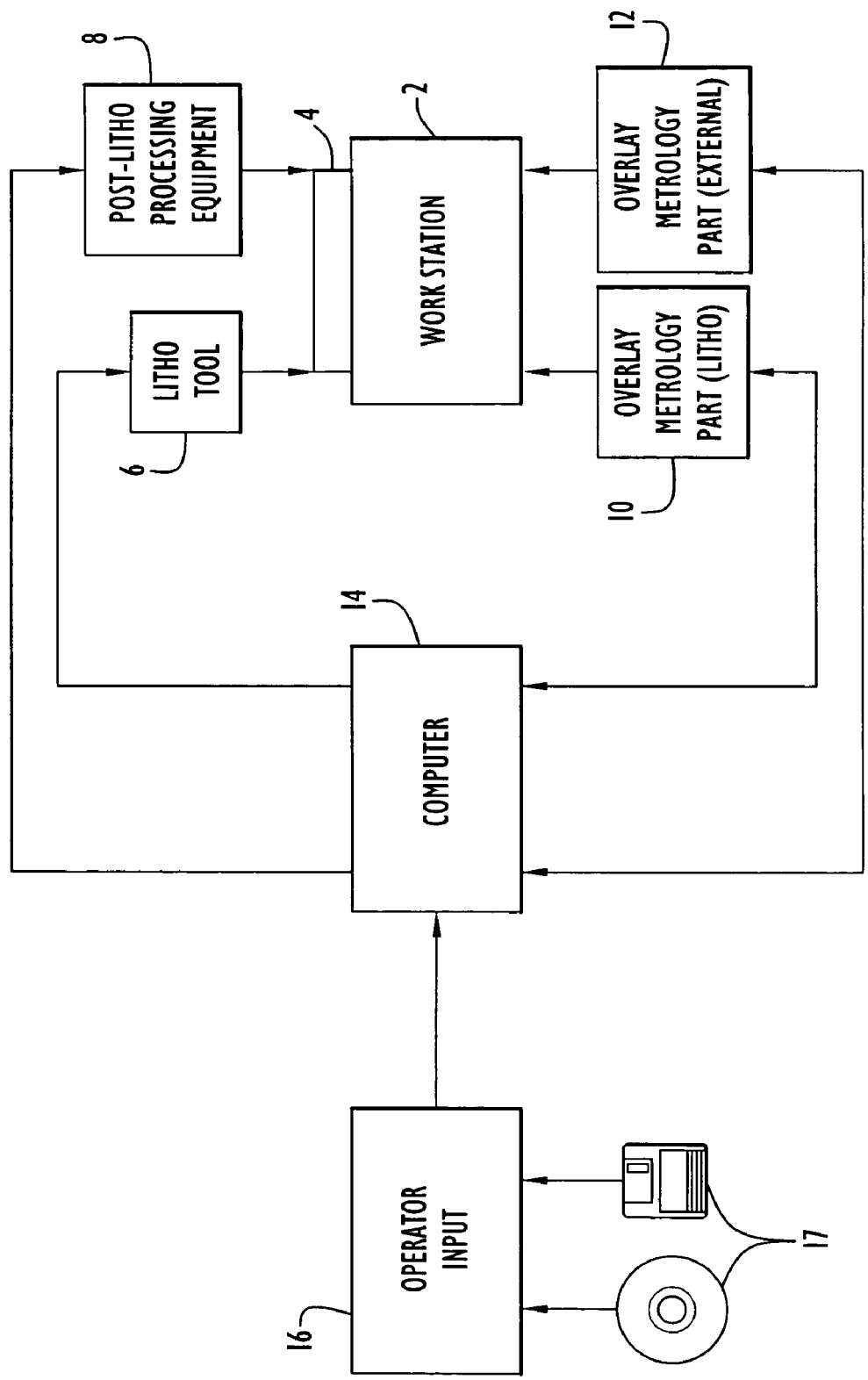
FIG. 1 is a block diagram showing an embodiment of a system which may be used to implement the present invention.

FIG. 1 is a block diagram of an example of a semiconductor manufacturing system in which the present invention can be implemented. A work station 2 is provided on which semiconductor wafer 4 disposition is applied. A lithography tool 6 is provided which is used to accomplish coating, alignment, exposure and development steps, with the result that a pattern is formed on a layer on wafer 4. Post-lithography processing equipment 8 is also provided, which may include systems for accomplishing etching, doping, material deposition and metallization, and may also include a system for accomplishing chemical-mechanical polishing (CMP).

Also present in FIG. 1 are systems for measuring overlay offset between respective levels of the wafer. These include overlay metrology part 10 for taking overlay measurements due to the lithography factors, and overlay metrology part 12 for taking overlay measurements due to post-lithography processing. A computer 14 is provided for controlling the operations performed on the wafer and for mathematically processing the overlay offset data for producing appropriate overlay offset corrections. Thus, it is seen that computer 14 communicates with both lithography tool 6 and post-lithography processing equipment 8 for controlling the operations performed on the wafers, and that it communicates with overlay metrology parts 10 and 12 for controlling the measurement of overlay offsets and for processing the measurements to produce corrections, which are fed to lithography tool 6 for positionally controlling the tool. While communication between the computer and the other components would typically be via a bus, direct connections are shown in FIG. 1 for clarity of illustration.

The operator input block 16 is an operator interface through which an operator would input necessary information to computer 14 for initiating and controlling a wafer fabrication process. Diskette 17 may contain a set of instructions for the computer for performing method routines in accordance with the present invention.

Figure 2:
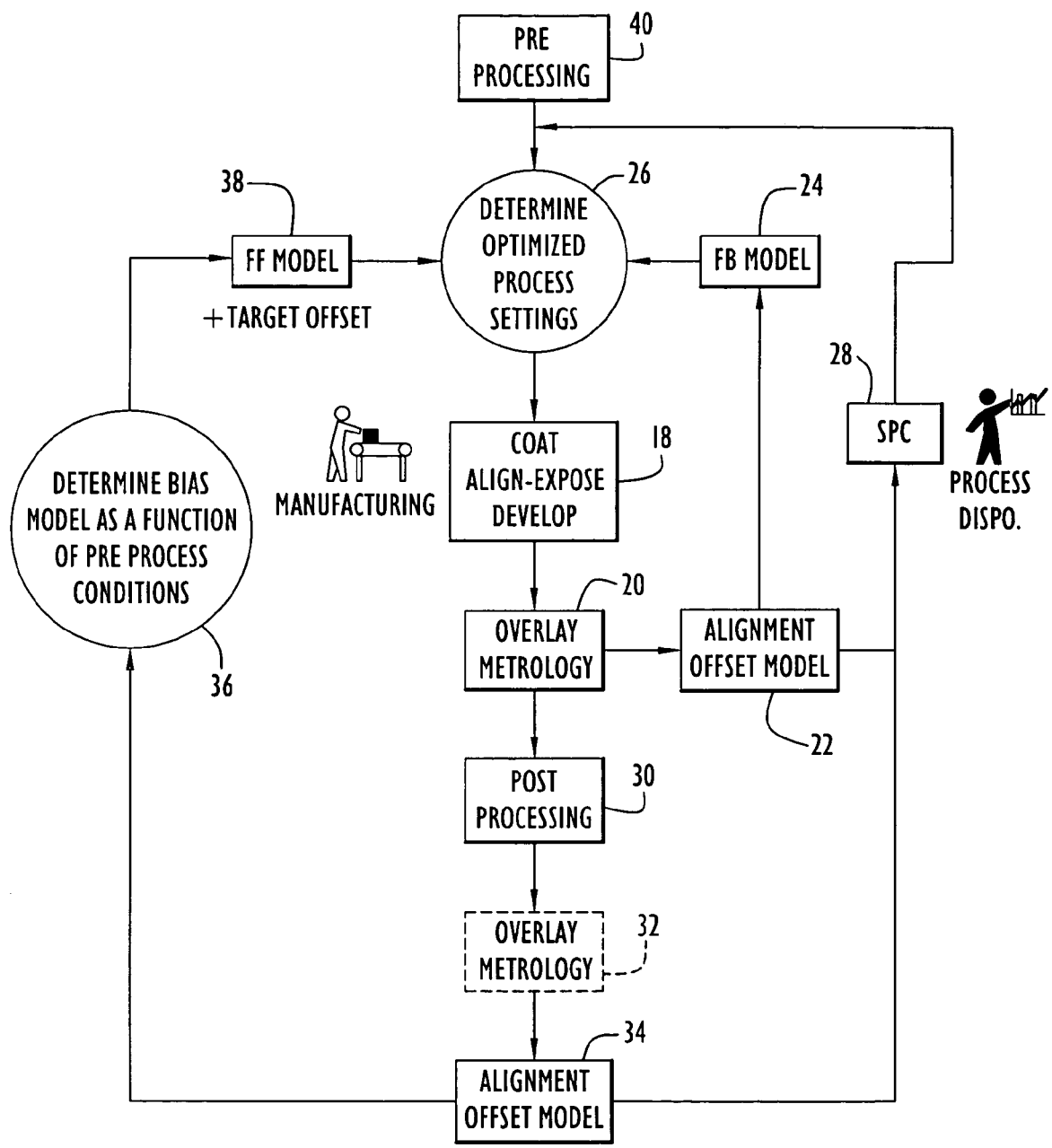
FIG. 2 is a flow chart depicting an embodiment of the method of the invention.

Referring now to FIG. 2, which is a flow chart depicting an embodiment of a method in accordance with the invention, it is seen that in step 18 a level of the wafer is coated, aligned and exposed, and developed. These operations result in the formation of a pattern on the wafer and would be performed with lithography tool 6 shown in FIG. 1. Thus, a "manufacturing" symbol appears next to step 18 in FIG. 2.

After a pattern is formed, the overlay offset between the level being worked on and the preceding layer is measured in the overlay metrology step 20, which would be performed by overlay metrology part 10 in FIG. 1. The usual "box in the box" marks may be used to determine offsets. However, step 20 results in raw X-Y data, and this must be converted to recognized offset categories, such as translation, rotation, magnification, and skew by processing the raw data with an alignment offset model in step 22. The modeled alignment offset information is fed back to effect positional control of the lithography tool to eliminate or minimize the error due to factors involved in the lithography process. This feedback is accomplished with feedback modeling step 24 which applies a weighting factor based on information obtained for the current lot as well as information about past lots. At step 26, the actual optimized positional settings for the lithography tool are determined, which are utilized in the lithography performed in step 18. The modeling steps 22 and 24 and the optimization step 26 are performed in computer 14 of FIG. 1.

Referring again to the flow chart of FIG. 2, the post processing is accomplished in step 30, and typically may comprise a number of operations including etching, doping, material deposition, and metallization. As mentioned above, the post processing may introduce offset errors which have nothing to do with the lithography process. For example, if the etching is non-uniform, the profile of etched pattern elements may not be perpendicular to the wafer. When material is deposited into etched regions its placement will not be correct, as there will be a translation. The error will be carried forward to the next level, and the pattern formed in the next level will not be correctly placed. It is thus desirable to characterize the offset error caused by etching immediately after the etching step.

Thus, step 32, measurement of post processing offset would occur after each process step which may produce an offset error. The step is performed in the same manner as step 20 described above and may be performed by overlay metrology part 12 shown in FIG. 1. In fact, although two overlay metrology parts 10 and 12 are shown in FIG. 1 for purposes of illustration, it is possible that there may be only one measuring part performing offset measurements for both lithography and non-lithography induced errors.

The measurement in step 32 is not typically taken for every lot of wafers, which is why the step appears in dotted lines. A bifurcated sampling scheme may be used with a greater amount of sampling being done while data is acquired to produce a predictive model, then is done after the model is established. By way of illustrative example, the sampling scheme may be 100% lot sampling for 3 wafers/lot for two to three months while data is acquired to produce a feed forward predictive bias model. After the bias model is established sampling may occur at a predetermined frequency for purposes of model validation only, e.g., three lots per week.

Alignment offset modeling step 34 is similar to step 22 described above in that it converts the raw X-Y data to meaningful offset information. In step 36, the offset information is correlated as a function of pre-process conditions to produce a bias model. For example, the pre-process condition being considered may be the age of a rotatable pad on a chemical-mechanical polishing (CMP) tool. As mentioned above, such pads have been known to impart a rotation offset to the wafer and to the alignment and overlay marks, and the degree of the offset has been found to be related to the age of the pad. Thus, offset data is accumulated as the pad ages, and in step 36 a model is created, which correlates the offset to the age of the pad. Then, when the age of a current pad to be used is inputted to the model, the degree of offset due to the pad may be predicted. Since physical and optical distortion to overlay and alignment marks may be due to a multiplicity of factors, the bias model may be a correlative function of a number of pre-process conditions. Such conditions may include the degree of non-uniformity of etch produced by an etching tool, the age of a target used in a sputter system for metal deposition, the state of a particular tool or tool chamber component, the batch, the process time, and whatever other process parameter is determined to be related to the measurement effect. The bias model produced in step 36 may include the use of a database and application server.

Pre-processing of the wafer as is necessary occurs in step 40, and it is at this point where the current pre-process conditions are determined. The current pre-process condition information is utilized in step 38 where it is incorporated in the bias model to determine the feed forward predictive target offset corrections which correspond to the current pre-process conditions. It is possible for each target offset to be represented as a polynomial $a_0+a_1x+a_2x^2+a_3x^3+a_4x^4+a_5x^5+ \ldots +a_nx^n$ where x corresponds to a specific offset. In step 26, the actual optimized settings for the lithography tool which correct the offset errors due to processing are determined from the information outputted by the feed forward model, and the appropriate corrections are utilized in lithography step 18.

It is noted that there may also a statistical process control (SPC) step 28 which occurs after each of offset modeling steps 22 and 34. In step 28, the offsets are compared against norms to see whether they are within acceptable limits. If not, the wafer may be re-worked or if the problem is severe, the entire system may be shut down. Such options are represented by the "Process Disposition" symbol in FIG. 2.

In accordance with a further aspect of the invention, after the lithography tool is positionally controlled to compensate for an offset error, the target offset is calibrated out of the overlay measurement so that zero offset overlay targets and standard disposition methods and rework procedures can be maintained. Because of such calibration, it is always the same "zero line" which is keyed to in the alignment process.

Figure 3:
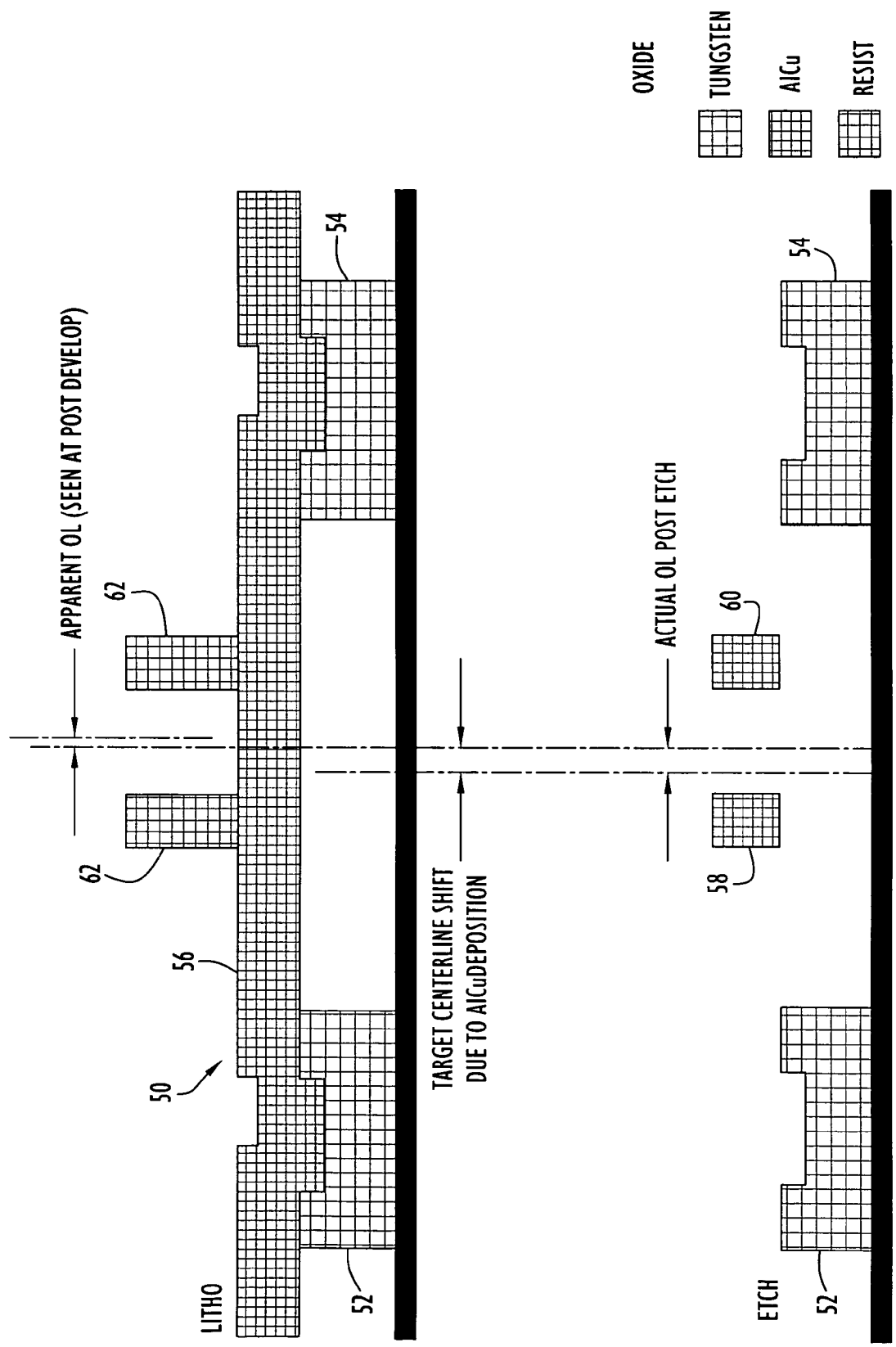
FIG. 3 illustrates an overlay problem.

FIG. 3 depicts an overlay problem which may be encountered in semiconductor fabrication. A wafer 50 is depicted, and the top part of the Figure shows the wafer at the lithography stage. The spacing between the two vertically extending broken lines represents the apparent overlay which is seen at post development. Elements 52 and 54 are tungsten, while element 56 is an aluminum-copper (AlCu) layer which has been deposited thereon. Elements 62 are photoresist.

When following the broken lines to below the top part of the Figure, the center line shift due to the AlCu deposition is seen. The lower part of the Figure depicts the wafer after the etching step, where the center line shift due to to AlCu deposition is manifested. Elements 58 and 60 are what remain of the AlCu after etch. The significant overlay present here is represented by the spacing between the broken lines.

Figure 4:
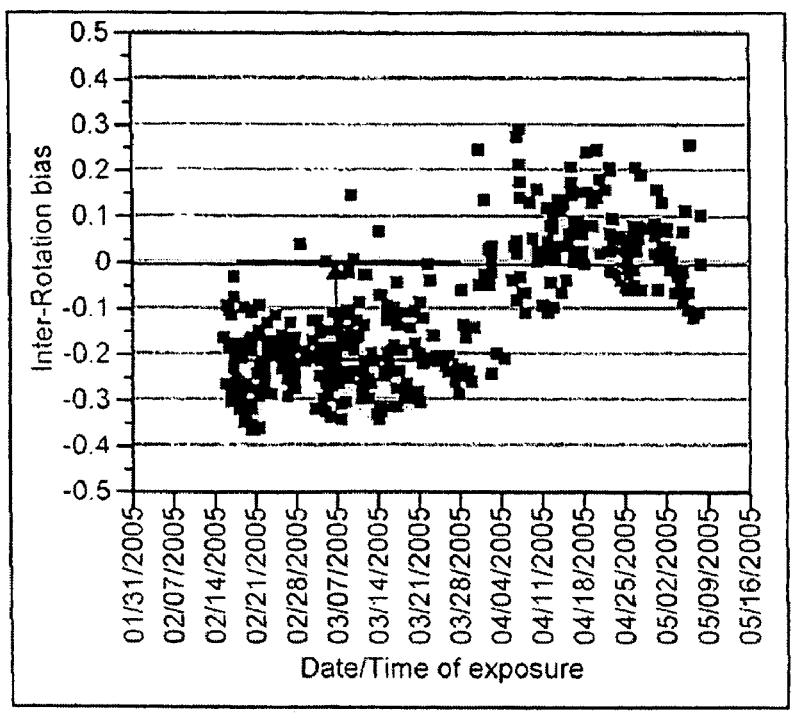
FIG. 4 is a graphical representation of the overlay problem of FIG. 3.

In the example of FIG. 3, the overlay being considered is of the rotation type. FIG. 4 is a graphical representation of interfield-rotation bias on the ordinate and date/time of exposure on the abscissa in which the process bias is characterized for the example of FIG. 3. The problem is shown by the substantial number of data points which are far from the zero line.

Figure 5:
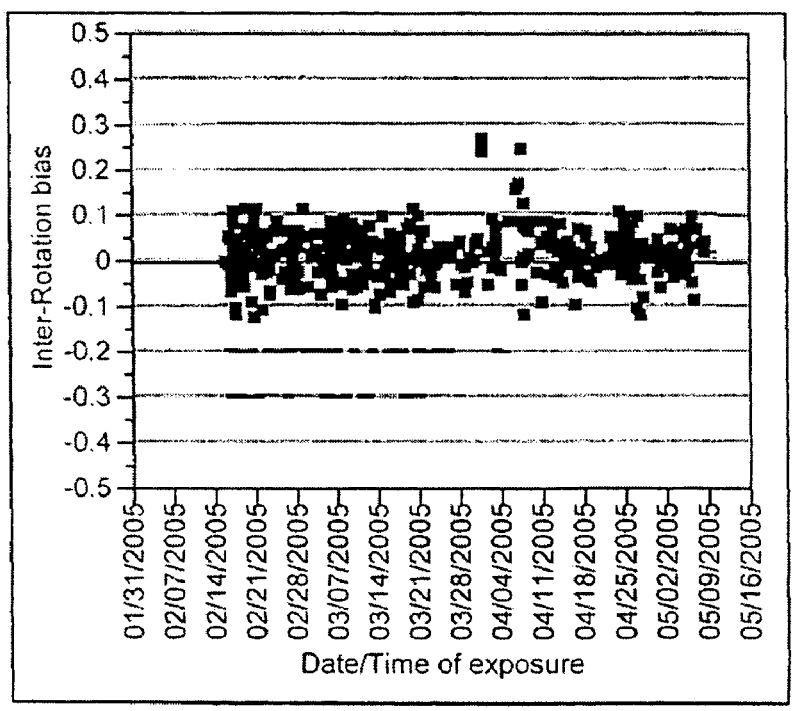
FIG. 5 is a graphical representation of the improved results achieved with the present invention.

FIG. 5 is a graphical representation similar to FIG. 4 at the lithography step after a bias correction provided in accordance with the method of the present invention is introduced. It is seen that most data points are clustered relatively close to the zero line.

It has been found that more accurate semiconductor devices may be manufactured with the process and system of the invention, functional yield may be increased, and frequent downstream overlay measurements to maintain accurate overlay performance may no longer be necessary.

It should be understood that while the invention has been described in detail and with reference to specific embodiments thereof, it will be apparent to one skilled in the art that various changes and modifications can be made therein without departing from the spirit and scope thereof. Accordingly, it is intended that such modifications and variations of the invention be covered provided they come within the scope of the appended claims and their equivalents.

We claim:

1. A method of controlling lithographic overlay offsets in the manufacture of semiconductor devices from wafers, comprising the steps of:

utilizing a lithographic tool to perform a lithographic process on a wafer layer, resulting in the formation of a lithographic pattern;

determining alignment offset corrections which are due to factors involved in the lithographic process;

feeding back the corrections to result in positional control of the lithographic tool;
post processing the wafer after the lithographic pattern is formed to enable fabrication of a semiconductor device;
predicting overlay offset corrections based on one or more factors involved in said post processing of the wafer, and
utilizing said predicted overlay offset corrections to positionally control the lithographic tool.

2. The method of claim 1 wherein said factors involved in the post processing of the wafer are pre-process conditions.

3. The method of claim 2 wherein determining alignment offset corrections comprises measuring alignment offset data between successive wafer layers and modeling said data to result in alignment offset information.

4. The method of claim 3 wherein predicting overlay offset corrections comprises measuring overlay offset data between successive wafer levels due to post processing of the wafer and modeling the data to result in post processing offset information.

5. The method of claim 4 wherein the alignment offset information and the post processing offset information are compared against norms to determine whether the wafer needs to be re-processed or the processing needs to be shut down.

6. The method of claim 4 wherein offset corrections are calibrated out of the overlay measurement to allow zero offset overlay targets to be used.

7. A method of controlling lithographic overlay offsets in the manufacture of semiconductor devices from wafers, comprising the steps of:
utilizing a lithographic tool on a wafer layer, resulting in the formation of a lithographic pattern;
post processing the wafer after the lithographic pattern is formed to enable fabrication of a semiconductor device;
measuring overlay offsets between successive levels of the wafer and from such measurements determining overlay offset corrections;
utilizing the overlay offset corrections to positionally correct the lithographic tool; and
calibrating the overlay offset corrections out of the overlay measurements to allow zero offset targets to be used.

8. A method of controlling lithographic overlay offsets in the manufacture of semiconductor devices from wafers, comprising the steps of:
forming a lithographic pattern on a wafer layer with a lithographic tool; post processing the wafer after the pattern is formed to enable fabrication of a semiconductor device;
predicting overlay offset corrections based on one or more pre-process conditions involved in said post processing of the wafer; and
utilizing said predicted overlay offset corrections to positionally control the lithographic tool;
wherein predicting said overlay offset corrections comprises;
measuring the overlay offsets between successive levels of a number of lots of said wafers,
correlating the measured offsets with respective pre-process conditions to create a model,
determining pre-process conditions for a current lot, and utilizing said pre-process conditions for a current lot along with information in said model to predict said overlay offset corrections.

9. A system for controlling lithographic overlay offsets in the manufacture of semiconductor devices from wafers, comprising:
means for forming a lithographic pattern on a wafer layer with a lithographic tool;
means for post processing the wafer after the pattern is formed to enable fabrication of a semiconductor device;
means for predicting overlay offset corrections based on one or more pre-process conditions involved in said post processing of the wafer; and
means for utilizing said predicted overlay offset corrections to positionally control the lithographic tool;
wherein said means for predicting said overlay offset corrections comprises;
means for measuring the overlay offsets between successive levels of a number of lots of said wafers,
means for correlating the measured offsets with respective pre-process conditions to create a model.
means for determining pre-process conditions for a current lot, and means for utilizing said pre-process conditions for a current lot along with information in said model to predict said overlay offset corrections.

10. The system of claim 9 wherein the pre-process conditions include state of top etch, specific types of film being processed, state of chemical-mechanical polishing (CMP) tool, and state of a sputtering tool which is used.

11. The system of claim 10 further comprising means for calibrating the predicted overlay offset corrections out of the overlay measurement to allow zero offset overlay targets to be used.

12. A storage medium containing a set of instructions which can be implemented by a computer for performing method steps for controlling lithographic overlay offsets in the manufacture of semiconductor devices from wafers, said method steps comprising:
forming a lithographic pattern on a wafer layer with a lithographic tool;
post processing the wafer after the pattern is formed to enable fabrication of a semiconductor device;
predicting overlay offset corrections based on one or more pre-process conditions involved in said post processing of the wafer; and
utilizing said predicted overlay offset corrections to positionally control the lithographic tool;
wherein predicting said overlay offset corrections comprises;
measuring the overlay offsets between successive levels of a number of lots of said wafers,
correlating the measured offsets with respective pre-process conditions to create a model,
determining pre-process conditions for a current lot, and
utilizing said pre-process conditions for a current lot along with information in said model to predict said overlay offset corrections.

13. The storage medium of claim 12 wherein the pre-process conditions include state of top etch, specific types of film being processed, state of chemical-mechanical polishing (CMP) tool, and state of a sputtering tool which is used.

14. The storage medium of claim 13 wherein said method steps further comprise calibrating the predicted overlay offset corrections out of the overlay measurement to allow zero offset overlay targets to be employed.

15. A method of controlling lithographic overlay offsets in the manufacture of semiconductor devices from wafers, comprising the steps of:

forming a lithographic pattern on a wafer layer with a lithographic tool;
post processing the wafer after the pattern is formed to enable fabrication of a semiconductor device;
predicting overlay offset corrections based on one or more pre-process conditions including pad age of a chemical-mechanical polishing (CMP) tool, specific type of film processed, target age of a sputtering tool, and state of top etch, said predicting including measuring the overlay offsets between successive levels of a number of lots of said wafers, correlating the measured offsets with respective pre-process conditions to create a model, determining pre-process conditions for a current lot, and utilizing said pre-process conditions for a current lot and the information in said model to predict said overlay offset corrections;
utilizing said predicted overlay offset corrections to positionally control the lithographic tool; and
calibrating the predicted overlay offset corrections out of the overlay measurement to allow zero offset targets to be used.

16. The method of claim 15 wherein the pre-process conditions include at least one of state of top etch, specific types of film being processed, state of chemical-mechanical polishing (CMP) tool, and state of a sputtering tool which is used.

17. The method of claim 16 further comprising calibrating the predicted overlay offset corrections out of the overlay measurement to allow zero offset overlay targets to be used.

* * * * *